(12) United States Patent
Kanazawa

(10) Patent No.: US 7,608,918 B2
(45) Date of Patent: Oct. 27, 2009

(54) SEMICONDUCTOR DEVICE

(75) Inventor: Masaki Kanazawa, Niiza (JP)

(73) Assignee: Sanken Electric Co., Ltd., Saitama (JP)

( * ) Notice: Subject to any disclaimer, the term of this patent is extended or adjusted under 35 U.S.C. 154(b) by 149 days.

(21) Appl. No.: 10/567,523

(22) PCT Filed: May 27, 2004

(86) PCT No.: PCT/JP2004/007264

§ 371 (c)(1),
(2), (4) Date: Feb. 6, 2006

(87) PCT Pub. No.: WO2005/018001

PCT Pub. Date: Feb. 24, 2005

(65) Prior Publication Data

US 2006/0202228 A1    Sep. 14, 2006

(30) Foreign Application Priority Data

Aug. 18, 2003   (JP) .............................. 2003-294208

(51) Int. Cl.
*H01L 21/58* (2006.01)
*H01L 23/492* (2006.01)
*H01L 23/36* (2006.01)

(52) U.S. Cl. ................ 257/684; 257/712; 257/777; 257/E25.027; 257/E21.614

(58) Field of Classification Search ................ 257/684, 257/686, 712, 777, E25.027, E21.614, 699; 438/109, 122, FOR. 368, FOR. 426, FOR. 413
See application file for complete search history.

(56) References Cited

U.S. PATENT DOCUMENTS 5,371,654 A * 12/1994 Beaman et al. ............. 361/744

| | | | |
|---|---|---|---|
| 5,532,512 A | 7/1996 | Fillion et al. | |
| 6,014,413 A * | 1/2000 | Golden et al. ............... | 375/347 |
| 6,055,148 A | 4/2000 | Grover | |
| 6,747,300 B2 | 6/2004 | Nadd et al. | |
| 7,115,922 B2 | 10/2006 | Nadd et al. | |
| 2004/0222507 A1* | 11/2004 | Chennupati ................. | 257/686 |

FOREIGN PATENT DOCUMENTS

| EP | 1172850 | 1/2002 |
|---|---|---|
| JP | 9-213877 | 8/1997 |
| JP | 2000-164800 | 6/2000 |
| JP | 2001-043985 | 2/2001 |
| WO | WO 02/058151 | 7/2002 |

OTHER PUBLICATIONS

European Search Report for EP04745370.9, dated Jul. 24, 2009.

* cited by examiner

*Primary Examiner*—George Fourson
(74) *Attorney, Agent, or Firm*—Bachman & LaPointe, P.C.

(57) ABSTRACT

A semiconductor device is provided which comprises a heat-radiative support plate 5; and first and second semiconductor elements 1 and 2 mounted and layered on support plate 5 for alternate switching of first and second semiconductor elements 1 and 2. The arrangement of piling and securing first and second semiconductor elements 1 and 2 on support plate 5 improves integration degree of semiconductor elements 1 and 2, and reduces the occupation area on support plate 5. Alternate switching of first and second semiconductor elements 1 and 2 controls heat produced from first and second semiconductor elements 1 and 2 because one of first and second semiconductor elements 1 and 2 is turned on, while the other is turned off.

12 Claims, 2 Drawing Sheets

SEMICONDUCTOR DEVICE

TECHNICAL FIELD

This invention relates to a semiconductor device, in particular, of the type made in smaller size and provided with a plurality of power semiconductors mounted on a single support plate.

BACKGROUND OF THE INVENTION

A single semiconductor device of H-type bridge circuit 10 shown in FIG. 3 comprises first and third transistors 1 and 3 of high voltage side and second and fourth transistors 2 and 4 of low voltage side. First and second junctions $A_1$ and $A_2$ are provided respectively between an emitter electrode of first transistor 1 and a collector electrode of second transistor 2, and between an emitter electrode of third transistor 3 and a collector electrode of fourth transistor 4, and connected between first and second junctions $A_1$ and $A_2$ is an electric load 6 such as a cold cathode fluorescent lighting discharge tube driven by AC power.

In operation of bridge circuit 10, first and fourth transistors 1 and 4 and second and third transistors 2 and 3 are alternately turned on and off for alternate switching to cause adverse electric currents $I_1$ and $I_2$ to flow by turns through junctions $A_1$ and $A_2$ to activate load 6. Thus, switching operation of first to fourth transistors 1 to 4 converts DC power into AC power to turn on the discharge tube connected between junctions $A_1$ and $A_2$.

A prior art single semiconductor device comprised of H-shaped bridge circuit 10 shown in FIG. 3 is disadvantageous due to the increased plane size of the device because it requires a support plate (not shown) of larger size to mount all of first to fourth transistors 1 to 4 and a control IC therefor on a common plane of the support plate. To overcome such a disadvantage, for example, Japanese Patent Disclosure No. 55-111151 presents a semiconductor device which has two semiconductor elements in the vertically layered structure to reduce the occupation area. However, if power semiconductor elements are vertically layered in H-shaped bridge circuit, they inconveniently produces intensive heat during the operation without the desired heat radiation, causing deterioration in electric property of the semiconductor elements.

Accordingly, an object of the present invention is to provide a semiconductor device which has a plurality of semiconductor elements layered in a smaller occupation area and operable with the desired heat radiation.

SUMMARY OF THE INVENTION

The semiconductor device according to the present first invention comprises a heat-radiative support plate (5); and first and second semiconductor elements (1, 2) mounted and layered on support plate (5) for alternate switching of first and second semiconductor elements (1, 2). The arrangement of piling and securing first and second semiconductor elements (1, 2) on support plate (5) improves integration degree of semiconductor elements (1, 2), and reduces the occupation area on support plate (5). Alternate switching of first and second semiconductor elements (1, 2) controls heat produced from first and second semiconductor elements (1, 2) because one of first and second semiconductor elements (1, 2) is turned on, while the other is turned off.

The semiconductor device according to the present second invention comprises a heat-radiative support plate (5); a first stack (7) which has first and second semiconductor elements (1, 2) layered and mounted in turn on support plate (5); a second stack (8) which has third and fourth semiconductor elements (3, 4) layered and mounted in turn on support plate (5). First and second semiconductor elements (1, 2) of first stack (7) and third and fourth semiconductor elements (3, 4) of second stack (8) contribute to form a H-type bridge circuit (10). Each of first to fourth semiconductor elements (1 to 4) has a switching element; and first and fourth semiconductor elements (1, 4) and second and third semiconductor elements (2, 3) are alternately switched to drive a load (6) by AC power converted through H-type bridge circuit (10) connected to DC power source.

The semiconductor device according to the present third invention comprises a heat-radiative support plate (5); first and second power semiconductor elements (1, 2) layered and mounted in turn on support plate (5); and a radiating layer (11) mounted between first and second power semiconductor elements (1, 2). Each of first and second semiconductor elements (1, 2) has a switching element, and first and second semiconductor elements (1, 2) are connected to each other through radiating layer (11). When heavy electric current flows through first and second semiconductor elements (1, 2), a large amount of heat produced from first and second semiconductor elements (1, 2) can be efficiently and fully discharged to the outside through radiating layer (11) mounted between first and second power semiconductor elements (1, 2) without deterioration in electric characteristics of first and second semiconductor elements (1, 2).

The semiconductor device according to the present fourth invention comprises a heat-radiative support plate (5); a first power semiconductor stack (7) which has first and second power semiconductor elements (1, 2) layered and mounted in turn on support plate (5); a second power semiconductor stack (8) which has third and fourth power semiconductor elements (3, 4) layered and mounted in turn on support plate (5). Each of first, second, third and fourth semiconductor elements (1 to 4) has a switching element. First and second radiating layers (11, 12) are mounted respectively between first and second semiconductor elements (1, 2) and between third and fourth semiconductor elements (3, 4). First and second semiconductor elements (1, 2) are connected to each other through first radiating layer (11); and third and fourth semiconductor elements (3, 4) are connected to each other through second radiating layer (12). Although first and second power semiconductor stacks (7, 8) are concurrently mounted on single support plate (5), sufficient amount of heat can be released outside through first and second radiating layers (11, 12) mounted respectively between first and second semiconductor elements (1, 2) and between third and fourth semiconductor elements (3, 4), thereby preventing degradation in electric property of first to fourth semiconductor elements (1 to 4). Also, first and second radiating layers (11, 12) serve to reduce each conductive path for electric current flowing through first and second power semiconductor stacks (7, 8) because first and second radiating layers (11, 12) are in direct contact to first and second semiconductor elements (1, 2) and to third and fourth semiconductor elements (3, 4), preventing occurrence of noise and electric power loss resulted from elongated conductive path for electric current.

Although heavy current runs through plural semiconductor elements in the semiconductor device according to the present invention, no local excessive heat can be generated, prohibiting deterioration in electric property of the device, extending service life of the device and improving reliability of the device.

BRIEF DESCRIPTION OF THE DRAWINGS

The above-mentioned and other objects and advantages of the present invention will be apparent from the following description in connection with preferred embodiments shown in the accompanying drawings wherein.

(1) . . . a first semiconductor element (a first transistor), (2) . . . a second semiconductor element (a second transistor), (3) . . . a third semiconductor element (a third transistor), (4) . . . a fourth semiconductor element (a fourth transistor), (5) . . . a support plate, (6) . . . a load, (7) . . . a first power semiconductor stack, (8) . . . a second power semiconductor stack, (10) . . . a H-type bridge circuit, (11, 12) . . . radiating layers, (13) . . . a control circuit, (14, 15, 16, 17, 18, 19) . . . brazing material (solder),

BEST MODE FOR CARRYING OUT THE INVENTION

Figure 1:
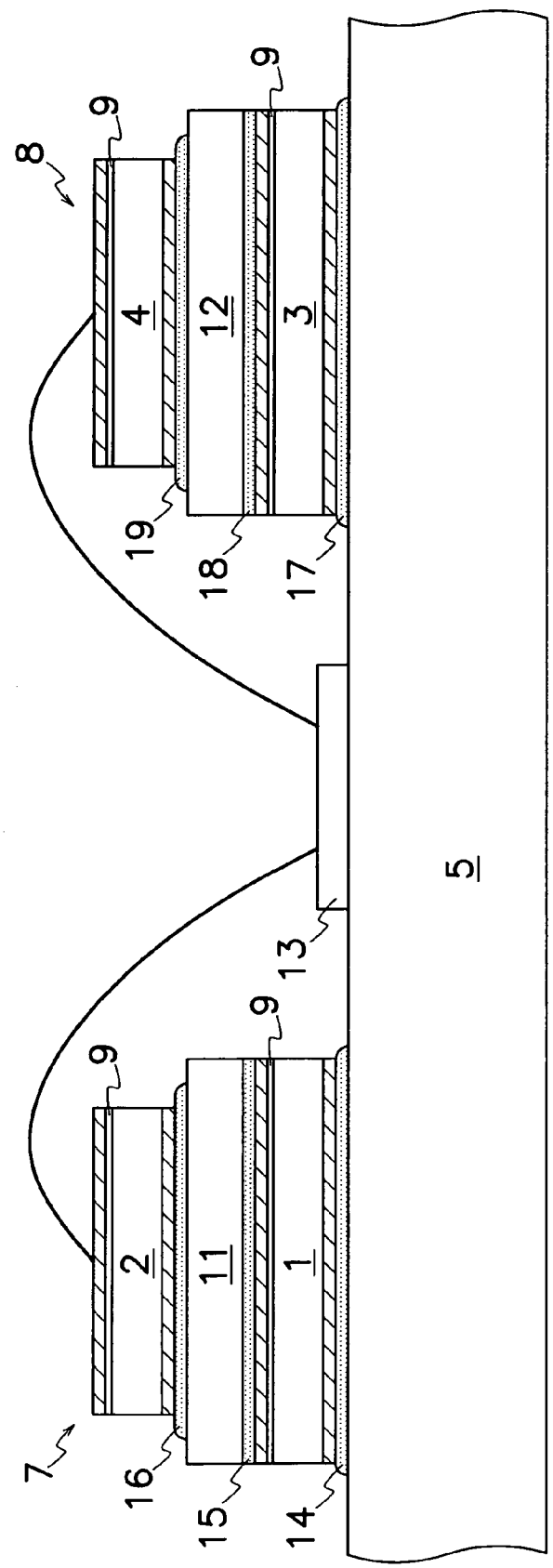
FIG. 1 is a side elevation view of the semiconductor device according to the present invention before packaging by plastic encapsulation.
Figure 2:
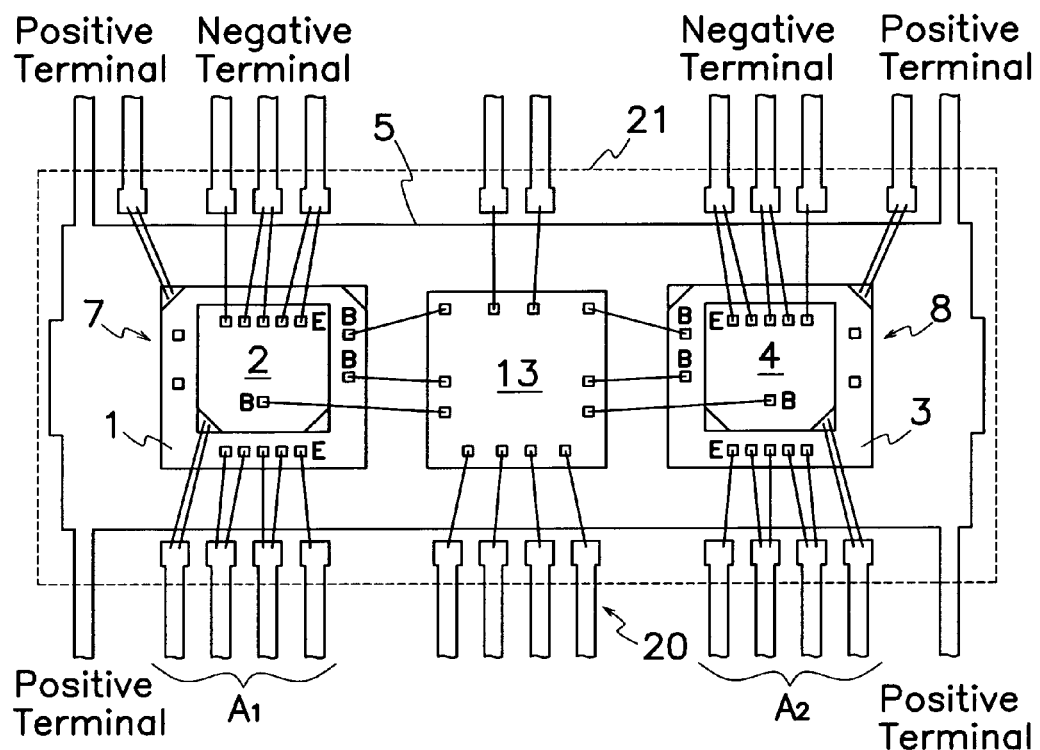
FIG. 2 is a plan view showing the interior of the semiconductor device of the present invention sealed by a plastic encapsulant.
Figure 3:
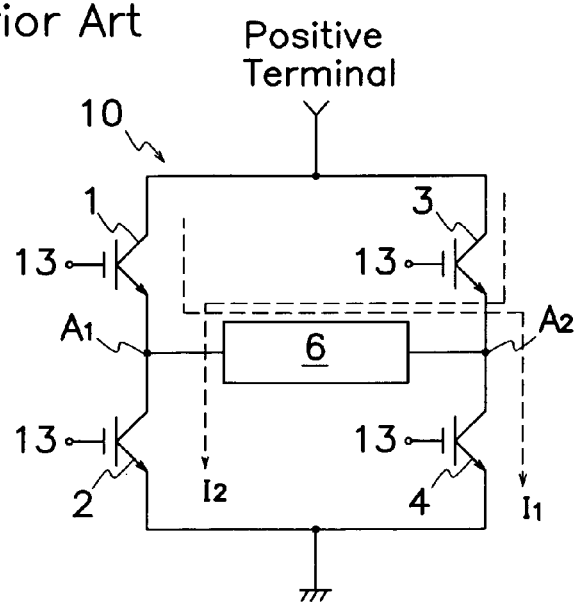
FIG. 3 is an electric circuit diagram of a prior art H-type bridge circuit.

Embodiments of the semiconductor device according to the present invention will be described hereinafter in connection with FIGS. 1 and 2 of the drawings. Same reference symbols as those shown in FIG. 3 are applied to similar portions in FIGS. 1 and 2.

The semiconductor device according to the first present invention comprises a metallic support plate 5 formed of heat-radiative copper or aluminum; first and second power semiconductor stacks 7 and 8 separately mounted on support plate 5; and a control circuit 13 of a semiconductor integrated circuit mounted on support plate 5 between first and second semiconductor stacks 7 and 8. First semiconductor stack 7 comprises first and second transistors (first and second power semiconductor or switching elements) 1 and 2, and second semiconductor stack 8 comprises third and fourth transistors (third and fourth power semiconductor or switching elements) 3 and 4. First to fourth transistors 1 to 4 are insulated gate bipolar transistors (IGBT) for forming four power transistors in H-type bridge circuit 10 shown in FIG. 3.

Not shown, but each of first to fourth transistors 1 to 4 comprises a semiconductor substrate; base and emitter electrodes electrically connected to electrodes on semiconductor substrate; and a collector electrode formed on and electrically connected to a bottom surface. Interlayer insulation films 9 formed between emitter and base electrodes electrically isolate emitter and base electrodes. A collector electrode of first transistor 1 is secured on support plate 5 through a brazing material (solder) 14, and an emitter electrode of first transistor 1 is secured to a bottom surface of a first radiating layer 11 through a brazing material 15. A collector electrode of second transistor 2 is secured on first radiating layer 11 through a brazing material 16, and an emitter electrode of second transistor 2 is positioned at the uppermost location of first semiconductor stack 7. Similarly, a collector electrode of third transistor 3 is secured on support plate 5 through a brazing material (solder) 17, and an emitter electrode of third transistor 3 is secured to a bottom surface of a second radiating layer 12 through a brazing material (solder) 18. A collector electrode of fourth transistor 4 is secured on second radiating layer 12 through a brazing material 19, and an emitter electrode of fourth transistor 4 is positioned at the uppermost location of second semiconductor stack 8. In the illustrated embodiment of the invention, each of first and second radiating layers 11 and 12 comprises a heat sink of metallic plate such as copper or aluminum also called as a heat spreader which can discharge heat generated from mostly second and fourth transistors 2 and 4 to the outside. In lieu of metallic plates as heat sinks, radiating layers 11 and 12 may be formed of relatively thin solder layers. Each of emitter, collector and base electrodes in first to fourth transistors 1 to 4 shown in FIG. 2 is connected in the circuit configuration shown in FIG. 3 which comprises a plurality of lead terminals 20 connected to electrodes of first and second power semiconductor stacks 7 and 8 and control circuit 13. The semiconductor device has a plastic encapsulant 21 for sealing the whole circuit assembly and each inner end of lead terminals 20 whose outer ends extend out of plastic encapsulant 21.

In use, positive terminals of lead terminals 20 electrically connected to support plate 5 are in electric communication with a positive terminal of a DC power source not shown, and each emitter electrode of second and fourth transistors 2 and 4 is led to a negative terminal of DC power source. Each base terminal of first to fourth transistors 1 to 4 are connected to control circuit 13 formed of a semiconductor integrated circuit to receive control or drive signals from control circuit 13. When first and fourth transistors 1 and 4 are turned on, second and third transistors 2 and 3 is turned off to supply a first electric current $I_1$ to load 6. Then, when first and fourth transistors 1 and 4 are turned off, and second and third transistors 2 and 3 are turned off, electric current $I_2$ flows through load 6 in the adverse direction from that of first electric current $I_1$ to operate load 6 with AC power.

The semiconductor device according to this embodiment is different from prior art semiconductor device in the following respects:

1. Second and fourth transistors 2 and 4 of low voltage side are mounted on first and third transistors 1 and 3 of high voltage side to build first and second semiconductor stacks 7 and 8 which are secured on single support plate 5 with control circuit 13 mounted on support plate 5 between first and second semiconductor stacks 7 and 8.

2. First and second metallic radiating layers 11 and 12 are secured respectively between first and second transistors 1 and 2 and between third and fourth transistors 3 and 4.

3. First and fourth transistors 1 and 4 and second and third transistors 2 and 3 are alternately switched on and off.

4. First and second metallic radiating layers 11 and 12 electrically connect respectively between first and second transistors 1 and 2 and between third and fourth transistors 3 and 4.

The semiconductor device according to the present embodiment can discharge the following functions and effects:

1. Fastness of second or fourth transistor 2 or 4 on first or third transistor 1 or 3 can reduce occupation area of these transistors on support plate 5 and improve the integration degree. Also, alternate switching of first and second transistors 1 and 2 or third and fourth transistors 3 and 4 can afford to release full amount of heat from first to fourth transistors 1 to 4 to the outside to prevent local heat concentration and thereby excessive elevation of temperature in first or second semiconductor stack 7 or 8.

2. Electric load 6 can be driven with AC power converted from DC power by H-type bridge circuit 10 by alternately switching two pairs of switching elements, namely, first and fourth transistors 1 and 4 and second and third transistors 2 and 3.

3. Although intense heat rises from first and second transistors 1 and 2 through which heavy electric current flows, full amount of heat can be exhausted to the outside through first radiating layer 11 firmly attached between first and second transistors 1 and 2 which therefore are not subject to deterioration in electric property thereof.

4. Although first and second power semiconductor stacks 7 and 8 are mounted together on single support plate 5, no heat resulted from these stacks 7 and 8 degenerates electric property of first to fourth transistors 1 to 4 since full amount of heat can be released to the outside through first and second radiating layers 11 and 12 respectively sandwiched between first and second transistors 1 and 2 and between third and fourth transistors 3 and 4.

5. The semiconductor device does not need wire-bonding for electric connection between first and second transistors 1 and 2 and between third and fourth transistors 3 and 4 since mutual electric connection can be achieved by the stacked structures of first and second transistors 1 and 2 through first radiating layer 11 and of third and fourth transistors 3 and 4 through second radiating layer 12. In other words, the stacked structures can reduce each conductive path length for electric current flowing through first and second power semiconductor stacks 7 and 8 for shortened wired line, thereby preventing occurrence of noise and electric power loss resulted from elongated conductive path.

The above-mentioned embodiment of the present invention can be further modified. For example, in place of IGBT, the device can involve MOF-FETs or other typical or familiar bipolar transistors. Also, first to fourth semiconductor elements 1 to 4 may substitute, for transistors, compound elements including switching elements such as transistors and other semiconductor elements.

INDUSTRIAL APPLICABILITY

The present invention is applicable to a semiconductor device used in a driver for cold cathode fluorescent lighting discharge tubes.

What is claimed are:

1. A semiconductor device comprising a heat-radiative and metallic support plate;
    a plurality of lead terminals having positive terminals connected to said support plate and negative terminals disposed around said support plate;
    a first semiconductor stack which has first and second semiconductor elements layered and mounted in turn on said support plate, and a first electrically conductive and radiating solder layer mounted between said first and second semiconductor elements;
    a second semiconductor stack which has third and fourth semiconductor elements layered and mounted in turn on said support plate, and a second electrically conductive and radiating solder layer mounted between said third and fourth semiconductor elements; and
    a control circuit for controlling the switching operation of said first to fourth semiconductor elements so that said first and fourth semiconductor elements and said second and third semiconductor elements are alternately switched, and thereby when one of said first and second semiconductor elements and one of said third and fourth semiconductor elements are turned on together, the other of said first and second semiconductor elements and the other of said third and fourth semiconductor elements is turned off together;
    wherein said first to fourth semiconductor elements contribute to form a H-type bridge circuit;
    each of said first to fourth semiconductor elements is a switching element;
    each positive terminal of said lead terminals is connected to each end of a corresponding side surface in said support plate away from said first and second semiconductor stacks;
    each of said first and third semiconductor elements has a bottom electrode electrically connected to said support plate through different brazing materials;
    said first semiconductor element has an upper electrode electrically connected to a lower electrode in said second semiconductor element through said first radiating solder layer;
    said third semiconductor element has an upper electrode electrically connected to a lower electrode in said fourth semiconductor element through said second radiating solder layer;
    each of said second and fourth semiconductor element has a control electrode electrically connected to control electrodes in said control element through different lead wires; and
    each of said second and fourth semiconductor elements has an upper electrode electrically connected to said negative terminals through different lead wires.

2. The semiconductor device of claim 1, wherein one of said first and second semiconductor elements in the first semiconductor stack and one of third and fourth semiconductor elements in the second semiconductor stack form a switch of high voltage side in the H-type bridge circuit; and
    the other of said first and second semiconductor elements in the first semiconductor stack and the other of third and fourth semiconductor elements in the second semiconductor stack form another switch of low voltage side in the H-type bridge circuit.

3. The semiconductor device of claim 1 or 2, wherein a first electric current flows through said first and fourth semiconductor elements and said support plate when said first and fourth semiconductor elements are turned on;
    a second electric current flows through said second and third semiconductor elements and said support plate when said second and third semiconductor elements are turned on; and
    said first and second electric currents alternately flow through an electric load.

4. The semiconductor device of claim 1, wherein said control circuit is mounted on said support plate between said first and second semiconductor stacks.

5. The semiconductor device of claim 1, wherein said first and third semiconductor elements are disposed away from each other a longer distance than a size of said first semiconductor element.

6. The semiconductor device of claim 5, wherein said first semiconductor stack is mounted on said support plate near one side surface thereof; and
    said second semiconductor stack is mounted on said support plate near the other side surface thereof.

7. The semiconductor device of claim 6, wherein said positive terminals are connected to side surfaces of said support plate near opposite ends of each side surface.

8. The semiconductor device of claim 7, wherein said side surfaces of said support plate comprises opposed one and the other side surfaces; and said positive terminals are connected to said one and the other side surfaces respectively.

9. The semiconductor device of claim 7, wherein said negative terminals comprises a first negative terminal electrically connected to the upper electrode in said first semiconductor element through a first lead wire,
- a second negative terminal electrically connected to the upper electrode in said second semiconductor element through a second lead wire,
- a third negative terminal electrically connected to the upper electrode in said third semiconductor element through a third lead wire, and
- a fourth negative terminal electrically connected to the upper electrode in said fourth semiconductor element through a fourth lead wire;
- said first and third negative terminals are disposed around one side surface of said support plate; and
- said second and fourth negative terminals are disposed around the other side surface of said support plate.

10. The semiconductor device of claim 1, wherein the upper electrode in said first semiconductor element is electrically connected to the lower electrode in said second semiconductor element through a first junction;
- the upper electrode in said third semiconductor element is electrically connected to the lower electrode in said fourth semiconductor element through a second junction;
- a cold cathode fluorescent lighting discharge tube is provided between the first and second junctions and for operation of said discharge tube by AC power; and
- each of said first to fourth semiconductor elements is a power semiconductor element through which heavy electric current flows to operate said discharge tube.

11. The semiconductor device of claim 1, further comprising a plastic encapsulant for sealing the whole semiconductor device; and
- said lead terminals have outer ends extending out of said plastic encapsulant.

12. The semiconductor device of claim 1, wherein the upper electrode in said first semiconductor element is secured to a bottom surface of said first radiating solder layer through a first brazing material;
- the lower electrode in said second semiconductor element is secured on an upper surface of said first radiating solder layer through a second brazing material;
- the upper electrode in said third semiconductor element is secured to a bottom surface of said second radiating solder layer through a third brazing material; and
- the lower electrode in said fourth semiconductor element is secured on an upper surface of said second radiating layer through a fourth brazing material.

* * * * *